United States Patent
Jreij et al.

(10) Patent No.: US 7,612,508 B2
(45) Date of Patent: Nov. 3, 2009

(54) SYSTEM AND METHOD FOR COMMUNICATION WITH AN INFORMATION HANDLING SYSTEM COOLING FAN

(75) Inventors: Elie Jreij, Pflugerville, TX (US); Paul T. Artman, Austin, TX (US); Akkiah Choudary Maddukuri, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 666 days.

(21) Appl. No.: 11/031,831

(22) Filed: Jan. 7, 2005

(65) Prior Publication Data

US 2006/0152891 A1    Jul. 13, 2006

(51) Int. Cl.
*H02P 5/00* (2006.01)
(52) U.S. Cl. .................. 318/268; 318/400.01; 318/599; 318/811
(58) Field of Classification Search ................. 318/268, 318/400.01, 599, 811
See application file for complete search history.

(56) References Cited

U.S. PATENT DOCUMENTS

| | | | |
|---|---|---|---|
| 5,926,386 A * | 7/1999 | Ott et al. ........................ | 700/70 |
| 5,952,798 A * | 9/1999 | Jones et al. ................... | 318/268 |
| 6,040,668 A | 3/2000 | Huynh et al. ................ | 318/471 |
| 6,135,718 A | 10/2000 | Yang ............................ | 417/22 |
| 6,338,150 B1 * | 1/2002 | Johnson et al. ............... | 714/39 |
| 6,400,113 B1 * | 6/2002 | Garcia et al. ................. | 318/463 |
| 6,487,463 B1 * | 11/2002 | Stepp, III ..................... | 700/79 |
| 6,526,333 B1 * | 2/2003 | Henderson et al. .......... | 700/300 |
| 6,545,438 B1 * | 4/2003 | Mays et al. ................... | 318/254 |
| 6,563,284 B2 | 5/2003 | Teutsch et al. .............. | 318/599 |
| 6,597,972 B2 * | 7/2003 | Emberty et al. ............. | 700/304 |
| 6,717,376 B2 * | 4/2004 | Lys et al. ..................... | 315/292 |
| 6,871,300 B1 * | 3/2005 | Irving .......................... | 714/47 |
| 6,922,787 B2 * | 7/2005 | Karpel et al. ............... | 713/320 |
| 7,327,114 B2 * | 2/2008 | Verge .......................... | 318/599 |
| 7,415,322 B1 * | 8/2008 | Pearce et al. ................ | 700/300 |

* cited by examiner

*Primary Examiner*—Walter Benson
*Assistant Examiner*—Renata McCloud
(74) *Attorney, Agent, or Firm*—Hamilton & Terrile, LLP; Robert W. Holland

(57) ABSTRACT

An escape sequence coded in power commands from a system controller, such as a BMC, to a cooling fan controller directs the cooling fan to send identification information coded in tachometer readings to the system controller for use by an information handling system. Electronic confirmation of the cooling fan identification ensures compatibility of the information handling system and cooling fan at initial manufacture or subsequent repair. Communication of information over existing power and tachometer wires supports the electronic confirmation without adding additional communication lines. Further, once a communication link is established between an information handling system controller and a cooling fan, other functions are enabled, such as a reflash of the cooling fan controller firmware.

8 Claims, 2 Drawing Sheets

SYSTEM AND METHOD FOR COMMUNICATION WITH AN INFORMATION HANDLING SYSTEM COOLING FAN

BACKGROUND OF THE INVENTION

1. Field of the Invention

The present invention relates in general to the field of information handling system cooling fan operations, and more particularly to a system and method for communication with an information handling system cooling fan.

2. Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

With the growing importance of information handling systems to businesses and individuals, reliability has become an increasingly important factor in system design and selection. A growing number of components include monitoring subsystems that monitor for and report abnormal operations so that the risk of overall system failure and down time is decreased. If a failure of a component is detected or anticipated, the component is typically replaced as soon as practicable to avoid unnecessary downtime. Often, relatively inexpensive and non-complex components prove critical to the operation of an information handling system. For example, if one or more cooling fans of an information handling system fail, the system will quickly overheat leading to automated shutdown by safety systems that detect the overheating or, worse, leading to catastrophic failure of one or more components.

Information handling system cooling fans typically run at variable speeds to provide variable amounts of cooling airflow. Running a cooling fan at a reduced speed helps reduce acoustic noise and power consumption where higher speeds are not needed to cool information handling system components. Typically a feedback system is used to control cooling fan speed so that speed increases with operating temperature increases and decreases with operating temperature decreases. One type of cooling fan feedback system works with a three-wire configuration: a power wire, a ground wire and a tachometer wire. The tachometer wire provides fan speed measurements to a system controller located distal the fan. The controller adjusts the fan speed in response to changes in operating temperature by adjusting the power applied to the power wire. Another type of cooling fan feedback system works with a four-wire configuration: a power wire, a ground wire, a tachometer wire and a pulse width modulation (PWM) wire. Instead of controlling fan speed by varying the application of power, four-wire cooling fans send fan speed commands through the PWM wire so that a microcontroller on the cooling fan adjusts fan speed with a constant voltage supply.

A difficulty that sometimes arises with feedback controlled cooling fans is that an incorrect cooling fan model will be inserted into an information handling system to replace a failed cooling fan. If an incorrect cooling fan is inserted, the control of the cooling fan speed may be inaccurate resulting in cooling fan failure or the cooling fan running at too high or too low of a speed. Speeds that are too high create unnecessary acoustic noise and consume excess power while speeds that are too low may result in operating over temperatures and even system shutdown. Typically, in order to avoid installation of an incorrect cooling fan, parts numbers are placed on cooling fans by stickers or the like. However, these stickers may fall off, may be stuck to an incorrect fan type or may be ignored or misread at installation.

SUMMARY OF THE INVENTION

Therefore a need has arisen for a system and method which communicates identification and other information between a cooling fan and an information handling system.

In accordance with the present invention, a system and method are provided which substantially reduce the disadvantages and problems associated with previous methods and systems for communication between a cooling fan and an information handling system. An escape sequence of power commands to the cooling fan causes entry from a normal operating mode to a command mode that enables communication between the cooling fan and the information handling system. Communication to the cooling fan is accomplished with coded power commands sent serially through the power command wire. Communication from the cooling fan is accomplished with coded tachometer readings sent serially through the tachometer wire.

More specifically, a system controller, such as a Board Management Controller (BMC) of a server information handling system, controls normal fan operation by commanding fan speeds through a power command wire, such as a PWM wire, based on temperature and the fan speed provided from the fan on a tachometer wire. To obtain information from the cooling fan, the system controller sends a predetermined sequence of power commands to a fan communication module, such as a series of alternating high and low duty cycle commands. The fan communication module enters a command mode and responds with a predetermined sequence of tachometer readings, such as a high speed reading to indicate a high bit and a low speed reading to indicate a low bit. The fan communication module sends fan identification information to the system controller as serially-coded tachometer readings and receives instructions from the system controller as serially-coded power commands, such as instructions for reflash of the fan microcontroller. The system controller returns the fan to normal operations by sending an exit command or, the fan communication module automatically returns to normal operations after a predetermined time out.

The present invention provides a number of important technical advantages. One example of an important technical advantage is that cooling fans with existing three or four wire configurations communicate internal information to a connected information handling system without the need for an additional communication wire. The compatibility of a cooling fan with an information handling system is thus electronically confirmed by the communication of cooling fan identification information. Electronic confirmation of cooling fan compatibility may be used at information handling system manufacture and repair to make sure that the right type of fan is used with an information handling system. Cooling fan installation and maintenance is automated under software control to service and track fan types and failures across multiple information handling systems, such as upgrades to cooling fan microcontroller firmware by reflash of the firmware through the power command wire.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Communication between a fan and an information handling system is supported with coded signals sent to the fan through a power command wire as a predetermined sequence of power commands and coded signals sent from the fan through a tachometer as serially clocked information. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
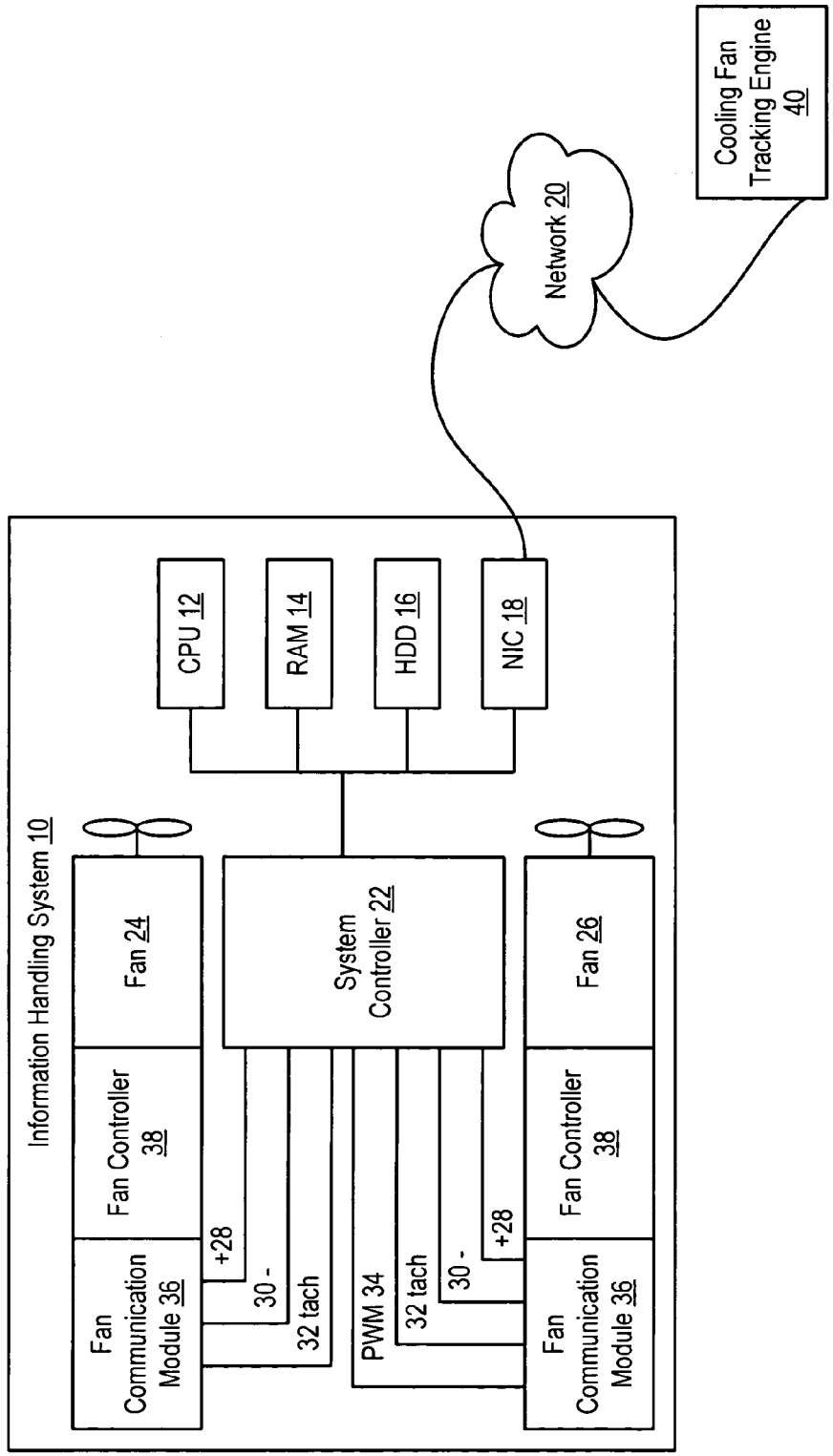
FIG. 1 depicts a block diagram of an information handling system having communication between a system controller and a cooling fan.

Referring now to FIG. 1, a block diagram depicts an information handling system 10 having communication between a system controller and a cooling fan through power and tachometer wires. Information handling system 10 has various processing components for processing information, such as a CPU 12, RAM 14, hard disc driver (HDD) 16 and a network interface card (NIC) 18 that supports communication over a network 20. The environment of information handling system 10 and interaction of its components are managed by a system controller 22, such as a Baseboard Management Controller (BMC) used in server information handling systems. System controller 22 manages the operation of a cooling fan 24 configured with three-wires and the operation of a cooling fan 26 configured with four wires. Three-wire configured cooling fan 24 has a power wire 28, ground wire 30 and tachometer wire 32 that connect to system controller 22 through a fan communication module 36. Fan communication module 38 provides cooling fan operation commands to a fan controller 38, which applies the commands to fan 24. Commands to three-wire configured fan 24 are sent as varying power levels over power line 28. Commands to four-wire configured fan 26 are sent as serial pulse width modulation (PWM) commands over a PWM line 34. System controller 22 determines appropriate fan speed in part by considering the measured fan speed provided by tachometer wire 32.

Under normal operations, system controller 22 manages information handling system internal temperature by varying the speed of cooling fan 24 or cooling fan 26. In order to obtain cooling fan information from the cooling fan, system controller 22 sends an escape sequence of predetermined power setting commands to fan communication module 36. For instance, with four-wire fan 26 the duty cycle on PWM line 34 is toggled between 100% and 0% four times within one second, or with three-wire fan 24 the power level on power line 28 is alternated between full on and full off. Fan communication module 36 detects the predetermined power command escape sequence and disables the application of subsequent power commands by fan controller 38 until communication is complete. Desired information is sent from fan communication module 36 to system controller 22 as high speed (1) or low speed (0) tachometer measurements. For instance, in response to the escape sequence, the fan communication module sends a two second high signal or other acknowledgement sequence and then serially clocks the cooling fan general information on tachometer line 32 at a fixed baud rate. For instance, identification information is formatted as asynchronous communication with start and stop bit around each byte. System controller 22 samples the tachometer readings and reads zero and one bits at the interval corresponding to the baud rate. System controller 22 forms the fan information into a string and reports the information though an appropriate interface, such as LCD, LAN, Comm port, or LPC bus interfaces.

Cooling fan identification information provided by a cooling fan to an information handling system allows electronic confirmation of cooling fan compatibility with the information handling system. For instance, a cooling fan tracking engine 40 interfaces with system controller 22 through network 20 to compare the identification information with allowed cooling fan identification information. A cross check of fan identification information during manufacture ensures that the correct cooling fan was installed into the information handling system during manufacture. A cross check of fan identification information after repair and replacement of a fan ensures that a compatible fan was installed. Further, cooling fan tracking engine 40 may compile a list of cooling fans installed in information handling systems across network 20 so that information technology administrators may track cooling fans for repairs. In one embodiment, system controller 22 sends information coded as power commands to fan communication module 36, such as information to reflash the firmware of fan controller 38. Once communication from system controller 22 is complete, an exit sequence is sent to fan communication module 36 to resume normal fan operations.

Figure 2:
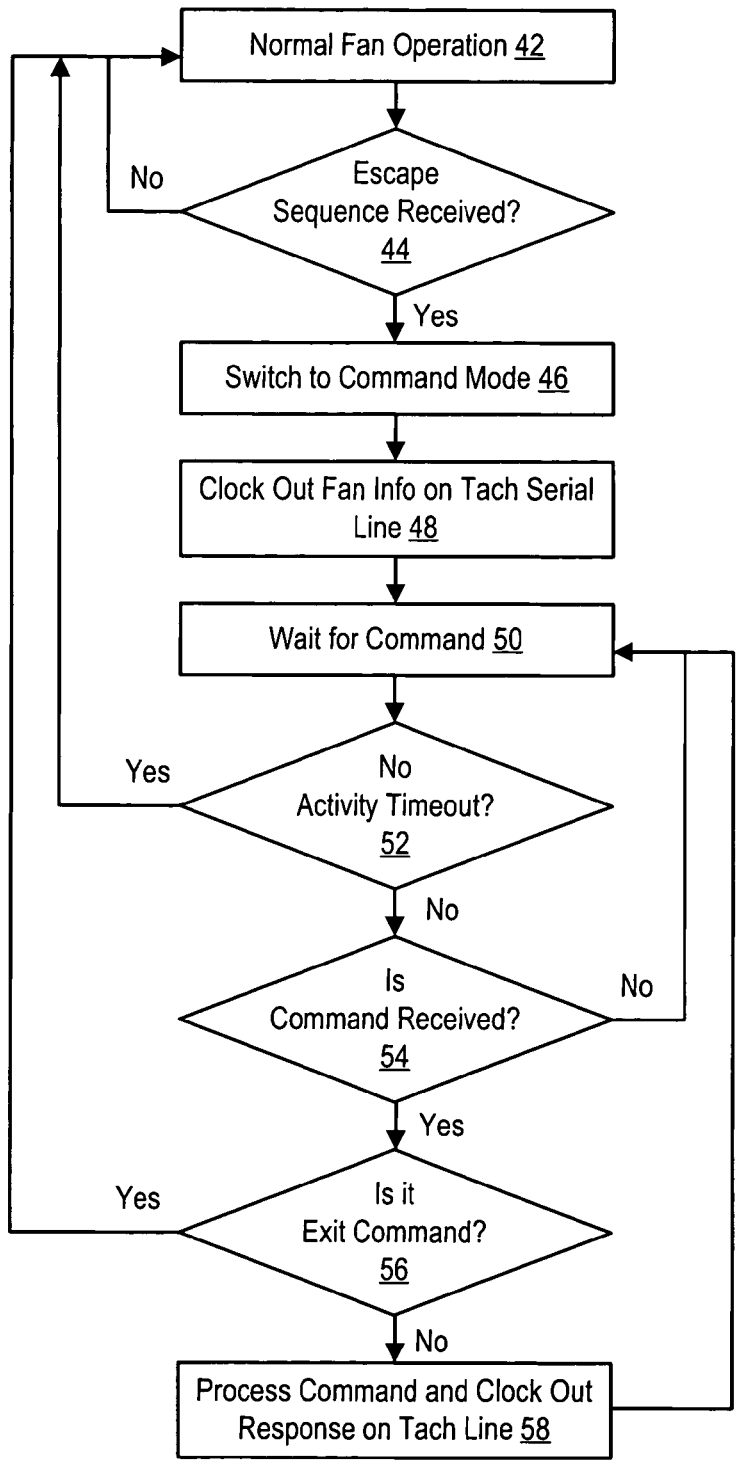
FIG. 2 depicts a process for establishing a communication link between an information handling system and a cooling fan.

Referring now to FIG. 2, a flow diagram depicts a process for establishing a communication link between an information handling system and a cooling fan. The process begins at step 42 with the fan in normal operating mode in which the fan responds to power commands with adjustments to fan speed and outputs measured fan speed on the tachometer wire. At step 44, if no escape sequence is received the process returns to step 42 for normal operations. If an escape sequence of power commands is received at step 44, the process continues to step 46 to enter the command mode for initiation of communication. At step 48, the fan information is clocked out as serially coded tachometer readings. Once the fan information is communicated, the process continues to step 50 to wait for another command. At step 52, if a timeout occurs before a command is received, the process returns to step 42 for normal operations. If a timeout has not occurred and a command is not received, the process returns to step 50 to await a command. If a command is received, then at step 56 a determination is made of whether the command is an exit command. An exit command returns the process to step 42 for normal operations. If a different command is received, the process continues to step 58 to process the command and clocks out an appropriate response on the tachometer wire. After the command is processed, the process returns to step 50 to await another command or timeout for exit to normal operations.

Although the present invention has been described in detail, it should be understood that various changes, substitutions and alterations can be made hereto without departing from the spirit and scope of the invention as defined by the appended claims.

What is claimed is:

1. A method for communication with an information handling system cooling fan, the method comprising:
   sending a predetermined sequence of cooling fan speed commands to the cooling fan from an information handling system processing component; and
   in response to the predetermined sequence, sending cooling fan identification information to the processing component through a cooling fan tachometer line.

2. The method of claim 1 wherein the predetermined sequence comprises alternating the cooling fan speed between predetermined levels in a predetermined time period.

3. The method of claim 2 wherein the alternating cooling fan speeds are alternating power levels sent on a power line.

4. The method of claim 2 wherein the alternating cooling fan speeds are alternating PWM signals.

5. The method of claim 1 further comprising:
   sending information coded as cooling fan speeds to the cooling fan;
   applying the information to reflash a microcontroller of the cooling fan; and
   sending an exit command coded as cooling fan speeds to the cooling fan to resume normal operations.

6. The method of claim 5 further comprising:
   sending information coded as tachometer readings from the cooling fan to confirm the microcontroller reflash.

7. The method of claim 1 further comprising:
   comparing the cooling fan identification with expected cooling fan information to determine the compatibility of the cooling fan with the information handling system.

8. A method for communication with an information handling system
   cooling fan, the method comprising: controlling cooling fan speed with commands sent through a first wire to the cooling fan from an information handling system processing component;
   sending cooling fan speed from the cooling fan to the information handling system processing component through a tachometer wire;
   sending a predetermined sequence of cooling fan speed commands to the cooling fan from an information handling system processing component to signal a request for identification information from the cooling fan; and
   in response to the predetermined sequence, sending the cooling fan identification information to the processing component through the tachometer wire.

* * * * *

UNITED STATES PATENT AND TRADEMARK OFFICE
CERTIFICATE OF CORRECTION

PATENT NO. : 7,612,508 B2  Page 1 of 1
APPLICATION NO. : 11/031831
DATED : November 3, 2009
INVENTOR(S) : Jreij et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 599 days.

Signed and Sealed this

Nineteenth Day of October, 2010

David J. Kappos
*Director of the United States Patent and Trademark Office*